United States Patent
Boucher et al.

(10) Patent No.: US 7,696,817 B1
(45) Date of Patent: Apr. 13, 2010

(54) AUTO-GAIN CORRECTION AND COMMON MODE VOLTAGE CANCELLATION IN A PRECISION AMPLIFIER

(75) Inventors: Richard Edward Boucher, Santa Clara, CA (US); Johan Hendrik Huijsing, Schipluiden (NL)

(73) Assignee: Maxim Integrated Products, Inc., Sunnyvale, CA (US)

(*) Notice: Subject to any disclaimer, the term of this patent is extended or adjusted under 35 U.S.C. 154(b) by 0 days.

(21) Appl. No.: 12/253,620

(22) Filed: Oct. 17, 2008

(51) Int. Cl.
*H03F 1/02* (2006.01)
(52) U.S. Cl. .......................... 330/9; 330/51
(58) Field of Classification Search .............. 330/9, 330/124 R, 295, 254, 84, 126, 51
See application file for complete search history.

(56) References Cited

U.S. PATENT DOCUMENTS

| | | | |
|---|---|---|---|
| 4,016,557 A * | 4/1977 | Zitelli et al. | 341/139 |
| 6,188,284 B1 * | 2/2001 | Shulman | 330/295 |
| 6,678,506 B1 * | 1/2004 | Dolman et al. | 455/127.3 |
| 7,132,883 B2 | 11/2006 | Huijsing et al. | |
| 7,209,000 B2 | 4/2007 | Huijsing et al. | |
| 7,397,302 B2 * | 7/2008 | Bardsley et al. | 330/51 |

OTHER PUBLICATIONS

Witte, J. F., et al., "A Current-Feedback Instrumentation Amplifier with 5 µV Offset for Bidirectional High-Side Current-Sensing", *2008 IEEE International Solid-State Circuits Conference, Session 3, Filters and Amplifiers*, 3.5, (2008), pp. 15-17.

* cited by examiner

*Primary Examiner*—Henry K Choe
(74) *Attorney, Agent, or Firm*—Blakely Sokoloff Taylor & Zafman LLP

(57) ABSTRACT

Auto-gain correction in a precision amplifier provides continuous calibration of the gain of the two differential input stages relative to each other and thus significantly minimizes the effects of device mismatch and temperature. Auto-gain correction together with auto-zero minimizes the effects of common mode input voltage on the amplifier and eliminates the need for trim associated with the matching of the two differential input stages. Improved gain matching enhances the accuracy of the auto-zero, which further improves the accuracy of auto-gain correction, resulting in a synergy with both operating together. The implementation of the auto-zero using an input pair of series capacitors in conjunction with a common input reference and a feedback pair of series capacitors in conjunction with a common feedback reference provides for decoupling the common mode voltage of the input differential pair or feedback differential pair. Various features may be used in sub-combinations as desired.

27 Claims, 12 Drawing Sheets

Shown with switches closed in Gain Correction mode $$VO - VREF = GA * (INP - INN)$$

$$GA = \frac{VO - VREF}{VFB - VREF} = \frac{I*(R1 + R2)}{I*(R1)} = \frac{R1 + R2}{R1}$$

AUTO-GAIN CORRECTION AND COMMON MODE VOLTAGE CANCELLATION IN A PRECISION AMPLIFIER

BACKGROUND OF THE INVENTION

1. Field of the Invention

The present invention relates to the field of precision instrumentation amplifiers that provide high gain accuracy and low input offset.

2. Prior Art

The accuracy of the DC output of a linear amplifier is subject to the physical imperfections of the individual devices comprising the amplifier. The errors caused by the imperfections are Input-Offset (VOS) and Gain Error (GE). The amplifier output (VO) is the algebraic sum of the amplifier Input (VI) and Input-Offset times the amplifier Gain (GA). The Input-Offset of the amplifier is the input required for a zero output. In practice the amplifier input offset is determined from the output of the amplifier for a zero input divided by the gain of the amplifier.

$$VO=GA*(VOS+VI)$$

$$VO=GA*VOS \text{ for } VI=0$$

$$\text{or } VOS=VO/GA \text{ for } VI=0$$

Generally, an instrumentation amplifier has two differential input stages with low input bias currents. FIG. 1 shows one form of an instrumentation amplifier with differential inputs INP and INN, and output VO with output reference VREF, and with 2 gain setting resistors R1 and R2. The first differential input stage (GM1) is the amplifier input path (INP & INN), the second differential input stage (GM2) is functionally identical to GM1 and is the feedback path which takes a fraction of the amplifier output (VFB−VREF) and feeds it back. These two differential inputs are then subtracted to determine an error. The output stage (GM3) adjusts the output voltage VO to try to force the error to zero, which results in the amplifier differential input and the feedback differential input being equal. If GM1 and GM2 are identical and the feedback error is zero, the ratio of the output to the feedback input is equal to the ratio of the total resistance to the feedback resistance, which is the gain of the instrumentation amplifier.

In an integrated circuit, input offsets are a result of minor defects and minor device mismatches in amplifier gain stages. Methods for obtaining extremely low input offsets have been well understood and used for many years prior to the development of monolithic integrated circuits. These methods usually involve some form of or combination of chopper amplifier, chopper stabilization and auto-zero. These techniques are very amenable to semiconductor fabrication, are effective over a very wide temperature range, eliminate the need for offset trimming and lower the overall cost of production.

Conversely, methods to obtain gain accuracy have usually required the need for trimming, and usually do not obtain gain accuracy over a wide temperature range or a wide input common mode voltage range, where the input common mode voltage is the average of the two differential inputs relative to a common ground.

The lack of gain accuracy is referred to as Gain-Error (GE). One source of Gain Error involves the accuracy of the feedback. A resistor divider network in the output path usually determines the feedback differential input. The relative accuracy of this resistor divider ratio limits the gain accuracy of the amplifier. Semiconductor techniques of resistor matching and resistor trimming allow for very accurate control of resistor divider ratios over wide temperature ranges, which in turn are very effective in minimizing the adverse impact of resistor divider ratios on gain accuracy.

The other source of gain error is the relative lack of matching of the two differential input stages of the instrumentation amplifier. These two input stages take the differential voltage at their inputs and each creates an output that will be differenced with the output of the other input stage to generate an error signal. The outputs of these input stages may be a current or a voltage, but in either case if these input stages are not identically matched, there will be a resulting gain error. Here again, trimming has been used to improve the matching of the two differential input stages. There are severe limitations to the effectiveness of trimming because the source of mismatch is not from resistors but from active semiconductor devices operating over widely differing common mode input voltage conditions and over wide temperature ranges.

FIG. 2 is an example of a chopper-stabilized instrumentation amplifier. The upper circuit path is a continuous, high-speed instrumentation amplifier, and constitutes the main amplifier. Continuous here implies that the amplifier is a linear, continuous time architecture and that there is no interruption to the signal flow. The circles at the non-inverting inputs with the label VOS represent the fact that the amplifiers are not perfect and have a finite input offset. Only one input offset VOS is shown in each amplifier, even though the amplifier may have two parallel input stages, the VOS shown being the net difference between the two differential inputs. The lower circuit path is the chopper correction path. The blocks with the X represent the choppers that are simply series switches which during one half the chopper period are connected from the input straight across to the output, and during the other half of the chopper period are connected diagonally across. The amplifier between the chopper blocks is an instrumentation amplifier that outputs a differential current proportional to the difference between the two pairs of differential input voltages. The amplifier block with the capacitors connected from output to input is used as an integrator, and integrates the differential current from the chopped instrumentation amplifier output. The output of the integrator is a differential voltage and the amplifier stage to the right of the integrator is a simple V to I (i.e., voltage to current or transconductance) conversion stage which outputs a differential current proportional to the differential voltage at the integrator output. This differential current is the correction current which is applied to the main amplifier.

The main amplifier is high bandwidth and dominates the amplifier output at high frequencies while the correction current from the chopper path dominates at low frequencies due to the error integrator in the chopper path. Offsets are extremely low frequency effects and are thus minimized by the chopper path.

The chopper-stabilized amplifier is well established in practice, and in professional and patent literature. For more recent developments, see for instance, U.S. Pat. No. 7,132,883, entitled "Chopper Chopper-Stabilized Instrumentation and Operational Amplifiers", and U.S. Pat. No. 7,209,000, entitled "Frequency Stabilization of Chopper-Stabilized Amplifiers", both of which are assigned to Maxim Integrated Products, Inc., the assignee of the present invention, the disclosures of which are hereby incorporated by reference. In general, the chopper frequency selected will be dependent on many parameters in the design and application. A typical frequency might be 10 kHz to 50 kHz.

The imperfections of the instrumentation amplifier between choppers resulting in input offset errors are represented by the circles with VOS at the non-inverting inputs. The result of proper application of chopping is to reduce the effect of the input offsets by several orders of magnitude. Thus the chopper path is the low offset path and the output of the chopped instrumentation amplifier is integrated (i.e., error is continuously accumulated) providing correction to the main instrumentation amplifier. Once the two differential inputs of the chopped instrumentation amplifier are equal the differential output current is zero and the integrator maintains that value as the correction.

BRIEF DESCRIPTION OF THE DRAWINGS

FIG. 4 illustrates an exemplary gain correction circuit used in the gain-corrected instrumentation amplifier of FIGS. 6a, 7a, and 8a.

FIG. 6b is a diagram illustrating a gain-corrected, auto-zeroed feedforward instrumentation amplifier system using the combined auto-zero correction and gain correction configuration of instrumentation amplifier of FIG. 5a.

FIG. 7b is a diagram illustrating a gain-corrected, auto-zeroed, chopper-stabilized feedforward instrumentation amplifier system using the combined auto-zero correction and gain correction configuration of instrumentation amplifier of FIG. 5a.

FIG. 8b is a diagram illustrating a gain-corrected, auto-zeroed, chopper-stabilized feedforward instrumentation amplifier system with sample-and-hold using the combined auto-zero correction and gain correction configuration of instrumentation amplifier of FIG. 5a.

DETAILED DESCRIPTION OF THE PREFERRED EMBODIMENTS

The present invention provides a means for continually calibrating the gain of the two differential input stages relative to each other and thus significantly minimizes the effects of semiconductor device mismatch, temperature and common mode input voltage. Embodiments of this invention also make use of auto-zero techniques in conjunction with chopper-stabilized techniques to eliminate trim and effectively reduce gain error associated with the matching of the two differential input stages.

Figure 1:
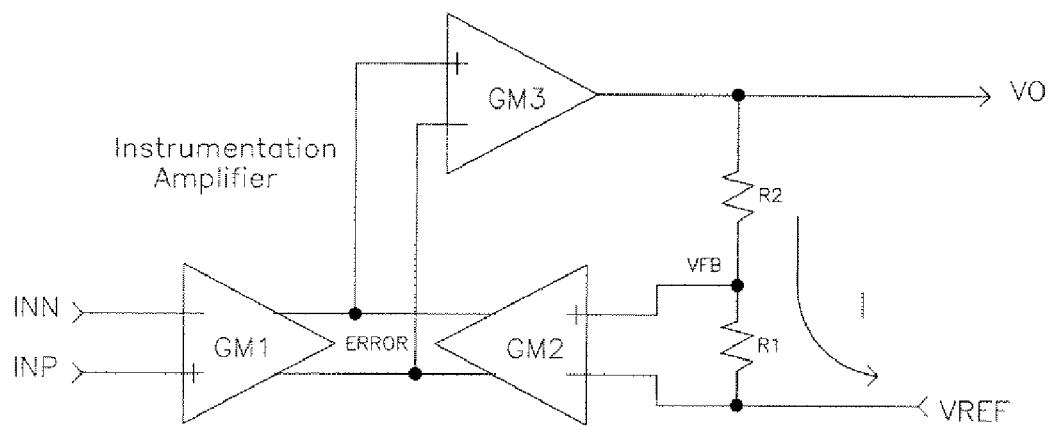
FIG. 1 illustrates one form of a prior art instrumentation amplifier with differential inputs INP and INN and output VO with output reference VREF.
Figure 2:
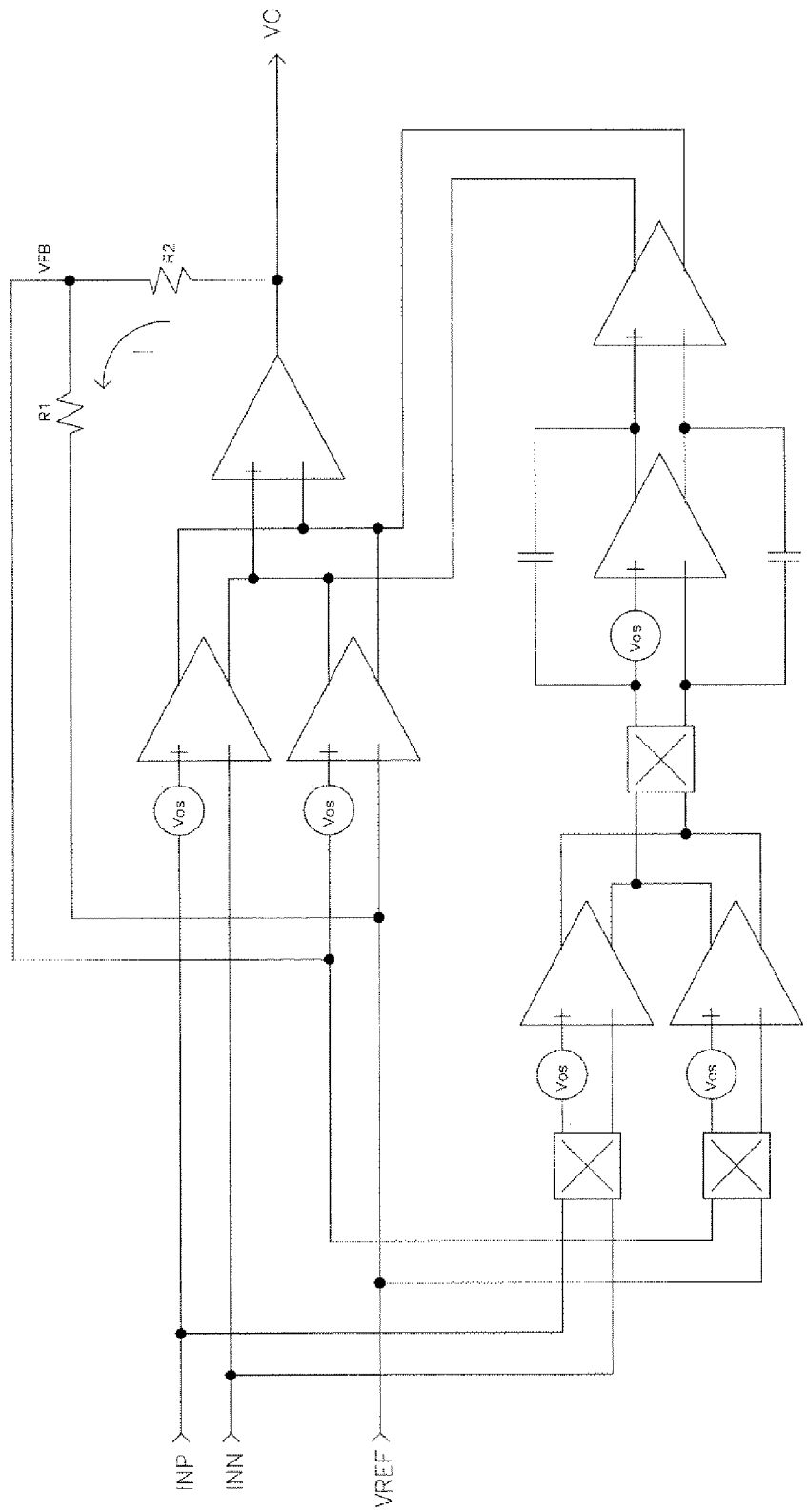
FIG. 2 illustrates another form of a prior art instrumentation amplifier using chopper stabilization.
Figure 3:
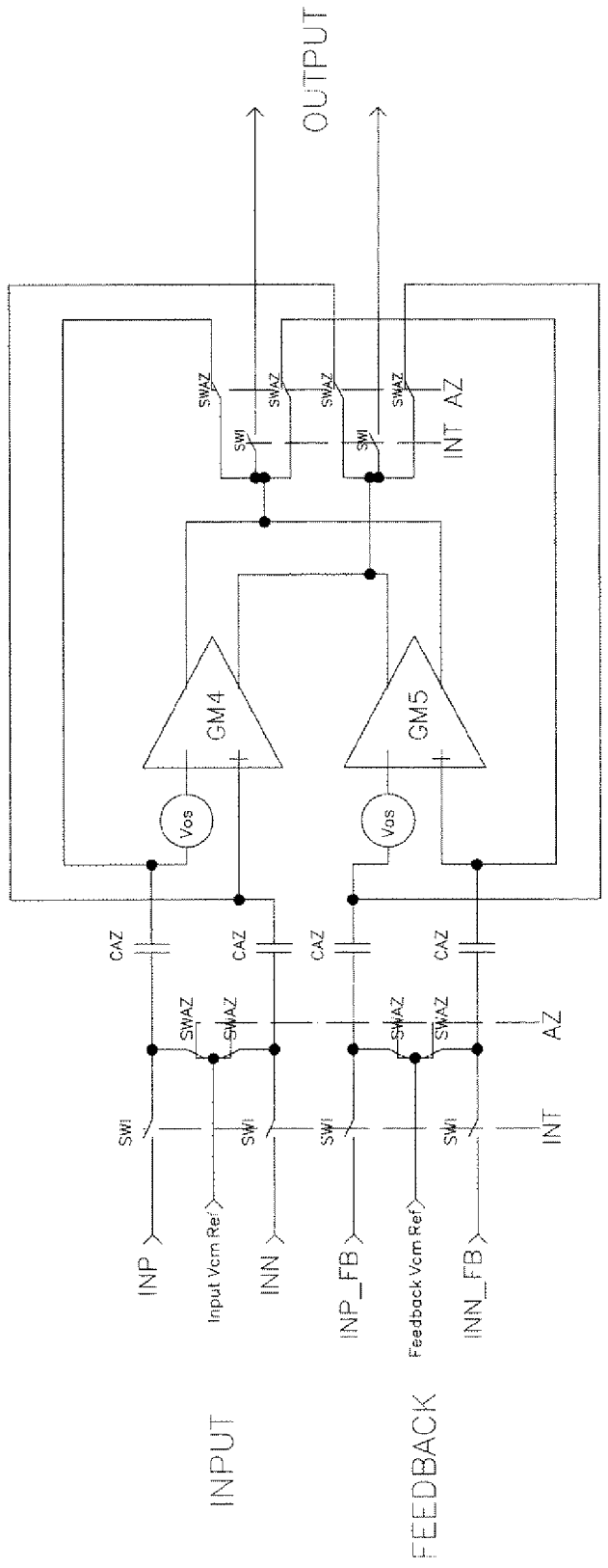
FIG. 3 illustrates an exemplary auto-zero circuit with input and feedback common-mode voltage cancellation used in the present invention.

FIG. 3 illustrates the use of auto-zero techniques with input and feedback common mode voltage cancellation on the instrumentation amplifier between the choppers of FIG. 2. In FIG. 3, it is useful to illustrate the instrumentation amplifier as two distinct transconductance stages with outputs differenced (subtracted from one another). The objective of auto-zeroing is to effectively remove the offset of an amplifier by inserting series capacitors (CAZ) with the inverted offset voltage stored thereon. At some regular interval, the signal path is interrupted and the voltage stored on the capacitors are updated. The voltages are updated by opening the input and output switches (SWI), disconnecting the input, output and feedback signals, and by closing the auto-zero switches (SWAZ) at the combined outputs of the two amplifier stages. In the embodiment shown in FIG. 3, all four inputs are capacitor coupled by capacitors CAZ, with an additional set of switches (SWAZ) that tie the input side of the CAZ capacitors for each amplifier in common to a common mode reference voltage: Input VCM Ref for the input pair of capacitors, and Feedback VCM Ref for the feedback set. This use of the Input VCM Ref and the Feedback VCM Ref for the common mode voltage cancellation embodies one of the features of this invention. This connection ties the amplifier in a unity gain configuration. There are various topologies which can be used for auto-zero that vary from a single CAZ capacitor storing the total input offset for both input stages of the amplifier, all the way to a topology similar to that shown with four CAZ capacitors, where the total offset voltage of the two stages is split equally between all CAZ capacitors. The particular topology shown has the advantage that the common mode voltage in both the input and the feedback may be effectively removed if Input VCM Ref is equal to the input common mode and Feedback VCM Ref is equal to the output common mode. Assuming a high gain, the differential inputs will be small, so this may be approximated by letting Input VCM Ref be equal to one of the input signals (INP or INN) and Feedback VCM Ref be equal to one of the feedback signals (INP_FB or INN_FB).

The incentive to use auto-zero techniques in addition to chopping, instead of chopping only, is to reduce output ripple. When chopping is used without auto-zero, the result of chopping will be to create a triangle wave at the output of the chopper-stabilized system. The output will be effectively ramping toward a positive output offset, then toward a negative output offset, and the magnitude of the triangle wave will be dependent on the magnitude of the offset, the chopping frequency and the bandwidth of the chopper path. Auto-zero without chopping will reduce ripple but will not reduce offset to as low a level as will chopping. Together, offset and ripple are both minimized.

When auto-zero is added to a chopper-stabilized amplifier system, the frequency of auto-zero and the duration of the auto-zero connection are not predetermined by the chopping frequency. The frequency and the fraction of time spent in auto-zero are design variables available to optimize a design. Even with the benefits of auto-zero there is an incentive to reduce the percent of time spent in auto-zero since that is when the useful input signal is blocked, and increasing the fraction of time spent in auto-zero can negatively impact bandwidth and phase margin (amplifier stability).

Figure 4:
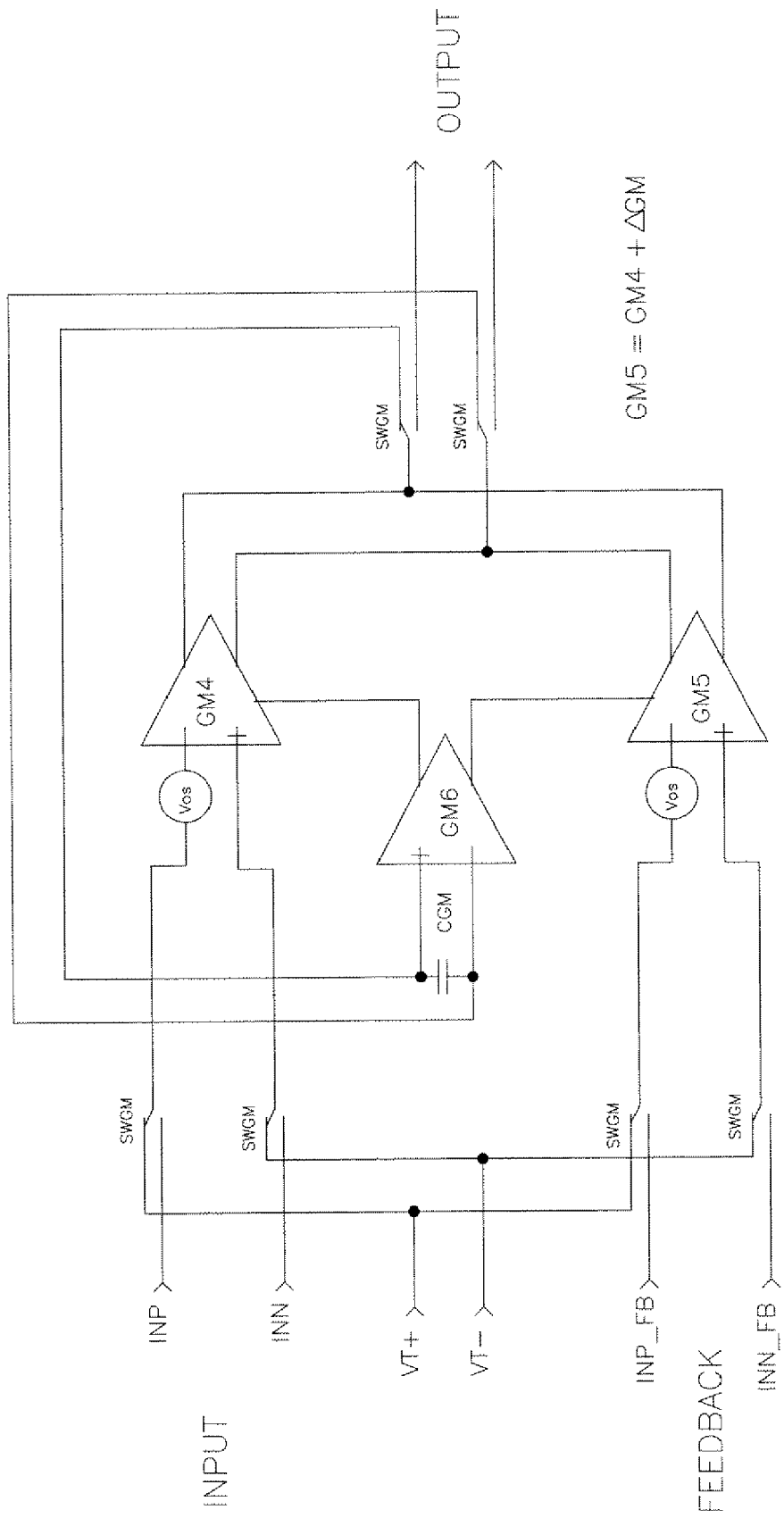

FIG. 4 shows an instrumentation amplifier similar to that of FIG. 3 with configuration switches SWGM at the inputs and outputs. This Figure illustrates the configuration needed for the gain correction which embodies one of the features of this invention. The two stages GM4 and GM5 from FIG. 3 are shown, and each has the circle with VOS (typically different offsets) at the non-inverting input. There is a third amplifier stage between GM4 and GM5 that will be called the gain correction amplifier stage. In this instance, the two stages GM4 and GM5 are now variable transconductance amplifiers.

Transconductance is the gain associated with converting from a differential voltage to a differential current. A simple transconductance stage is a differential pair of MOS devices with a current source connected to the common source of the differential pair. A variable transconductance amplifier is one in which the gain associated with converting differential voltage to differential current is made variable. One way of implementing this would be to make the current source connected to the common source of the differential pair controllable. The transconductance would increase as the magnitude of the current is increased. In general, transconductance amplifiers are well known in the art. Variable transconductance amplifiers are a subset of Variable Gain Amplifiers (VGA) and a discussion using CMOS transistors can be found in: Behzad Razavi, *Design of Analog CMOS Integrated Circuits*, First Ed., New York: McGraw-Hill, 2001.

FIG. 4 takes into account another imperfection in the manufacture of integrated circuits in addition to input offset discussed with respect to FIG. 3, that being that the two gain stages GM4 and GM5 are not perfectly matched. This is represented by GM5=GM4+ΔGM, where ΔGM represents the GM error between the two GM stages.

In FIG. 4 the CAZ capacitors and the SWI and SWAZ switches from FIG. 3 are not shown. Instead there are SWGM switches which, as shown, disconnect the input, output and feedback signals from the instrumentation amplifier, and connect a differential reference voltage ΔVT=[VT+]−[VT−] to each of the inputs. This is called the GM correction configuration. Assume for the moment that the auto-zero cycle has just taken place and the proper offset compensating voltage is held on the CAZ capacitors (not shown in FIG. 4). The differential reference voltage [VT+]−[VT−] will be appropriately fixed within the expected range of the amplifier input signals, such as somewhere between 20 mV and 100 mV for example. The outputs of the instrumentation amplifier are also switched via the SWGM switches to the differential inputs of the gain correction amplifier GM6, with a capacitor CGM across the differential input to GM6 to store the voltage when these switches are opened. The objective of the GM correction configuration is to force the GM error (ΔGM) between the two GM stages of the instrumentation amplifier to a minimum. Like the auto-zero connection, this connection is made periodically for a brief moment. When the connection is made, both of the variable transconductance amplifiers GM4 and GM5 see the same reference input [VT+]−[VT−], and since their outputs are differenced, when the gains are matched, the output will be zero. If their gains are not matched, the output will be non-zero, driving the differential input to GM6 to a value such that the gains are matched, with that value being stored on capacitor CGM. If the closed loop gain of the instrumentation amplifier is sufficiently high in this gain correction configuration, the resulting gain error of the two input stages of the instrumentation amplifier can be made very small. Uncorrected, the mismatch of the two GM stages GM4 and GM5 will vary significantly over the operating temperature range. With gain correction, the mismatch is repeatedly corrected independent of temperature.

As previously described, the implementation of the auto-zero using four capacitors, as shown in FIG. 3, where the input pair of capacitors is used in conjunction with a common input reference, Input VCM Ref, and the feedback pair of capacitors is used in conjunction with a common feedback reference, Feedback VCM Ref, provides a means for decoupling the common mode voltage of the input pair or feedback pair.

The common mode cancellation voltage of each pair is stored on the CAZ capacitors, in addition to the offset. These stored voltages transfer over to FIG. 5a (combining the auto-zero capability of FIG. 3 with the gain correction of FIG. 4) where this feature allows the two GM stages to continually operate at a constant and matched common mode condition, independent of the common mode of the differential input (INP−INN), further enhancing the matching of the stages. In a preferred embodiment, Input VCM Ref is taken as one of the inputs INP or INN, filtered through a simple low pass RC filter. Also in a preferred embodiment, Feedback VCM Ref is taken as one of the feedback signals INP_FB or INN_FB, also filtered through a simple low pass RC filter. While these are approximations, the differential signals will necessarily be relatively low for instrumentation amplifiers with substantial gain, so that the approximation will normally be quite good, far better than ignoring the effect of common mode variation. The choice of input and feedback signals preferred may depend on the application. By way of example, if one input were to operate at a fixed voltage, that input would normally be the preferred input to use for Input VCM Ref. Similarly, the preferred bandwidth of the low pass filter may be application dependent.

Figure 5A:
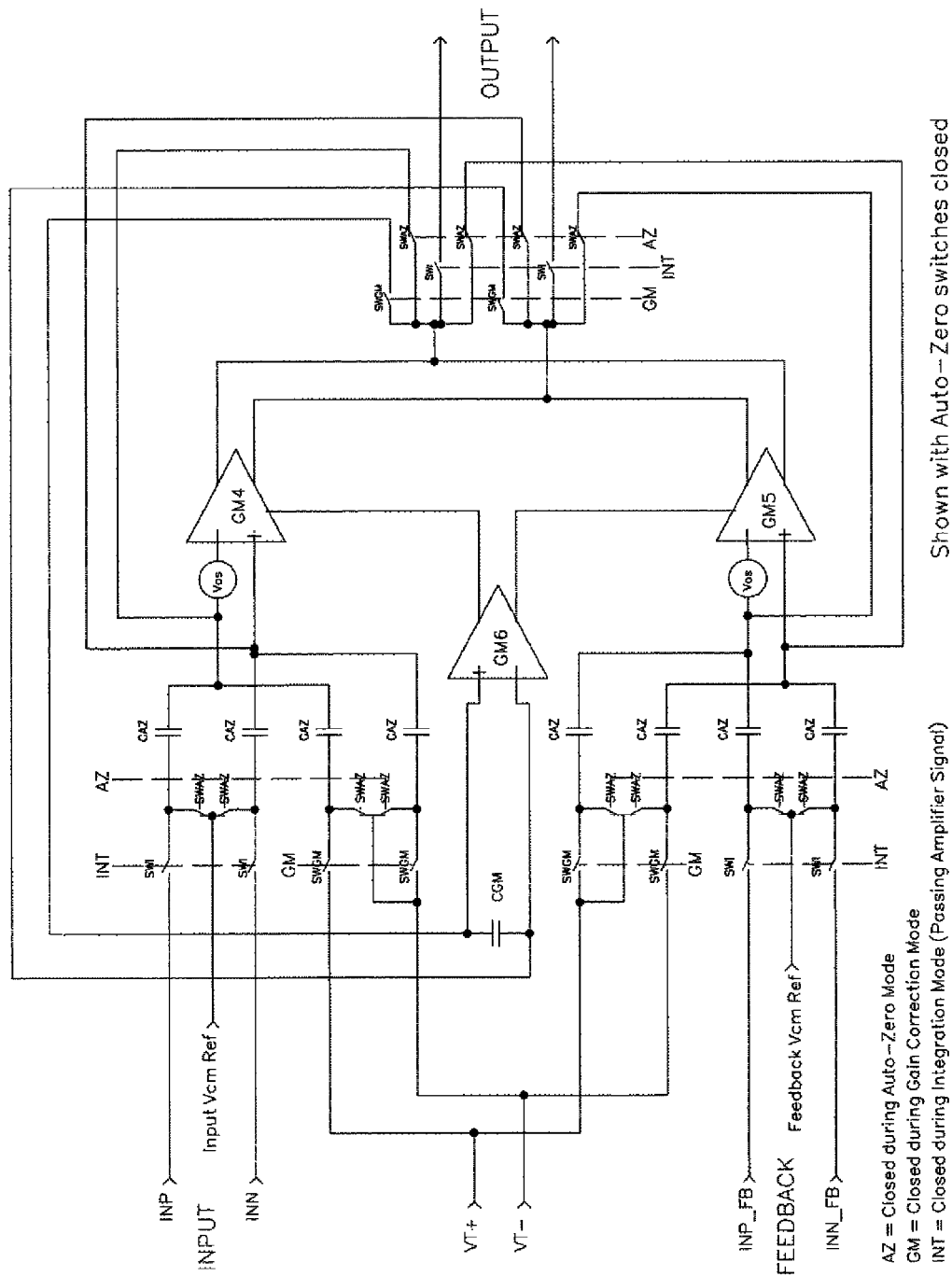
FIG. 5a illustrates the features of both FIG. 3 and FIG. 4 in an instrumentation amplifier.

There is a secondary benefit from gain correction in the combined circuit of FIG. 5a, and that is to improve the accuracy of auto-zero correction. In a first-order analysis of auto-zero, there is the assumption that the gains in each half of the instrumentation amplifier match, but in fact in a real integrated circuit there is a finite GM mismatch which results in a finite auto-zero error. If a factor for gain mismatch is included in the auto-zero analysis, it can be shown that the GM mismatch degrades the auto-zero correction obtained in the circuit of FIG. 3. Correspondingly, a residual error in the auto-zero correction results in a finite error in the gain correction obtained in the circuit of FIG. 4. When there is a sequence that includes alternating between auto-zero and gain correction which is made possible by the circuit of FIG. 5a, it can be shown that the residual errors of both will be reduced in steps as an iterative improvement.

The use of auto-zeroing with gain correction as in FIG. 4 is preferable because of the complementary effect each has on the other, as explained above. However the use of the gain correction without using auto-zeroing as shown in FIG. 4 can also be beneficial, as a significant gain correction may be made assuming that the [VT+]−[VT−] differential input for the gain correction reasonably dwarfs the difference in input offsets Vos of GM4 and GM5.

Figure 5B:
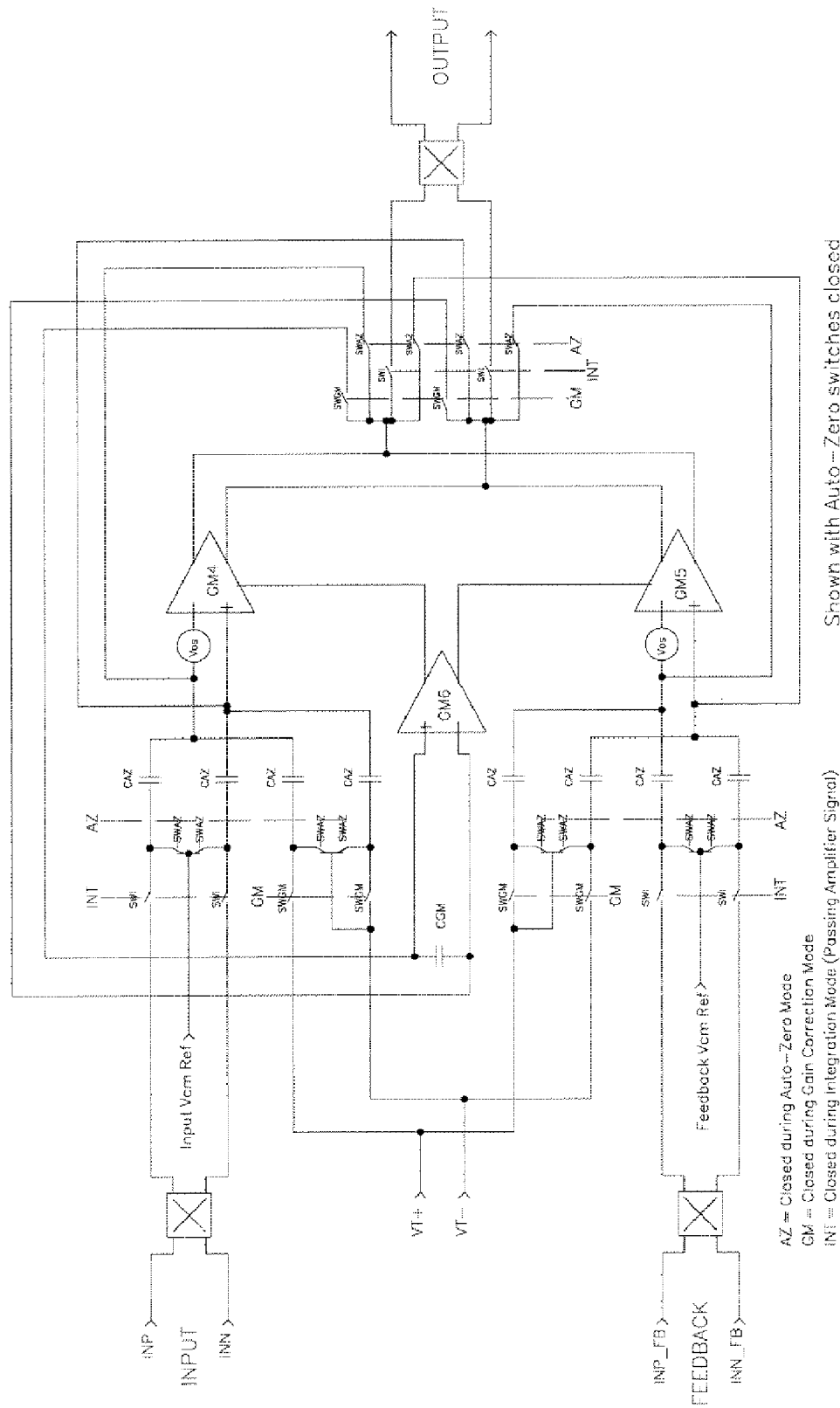
FIG. 5b illustrates the features of both FIG. 3 and FIG. 4 in an instrumentation amplifier with choppers.
Figure 6A:
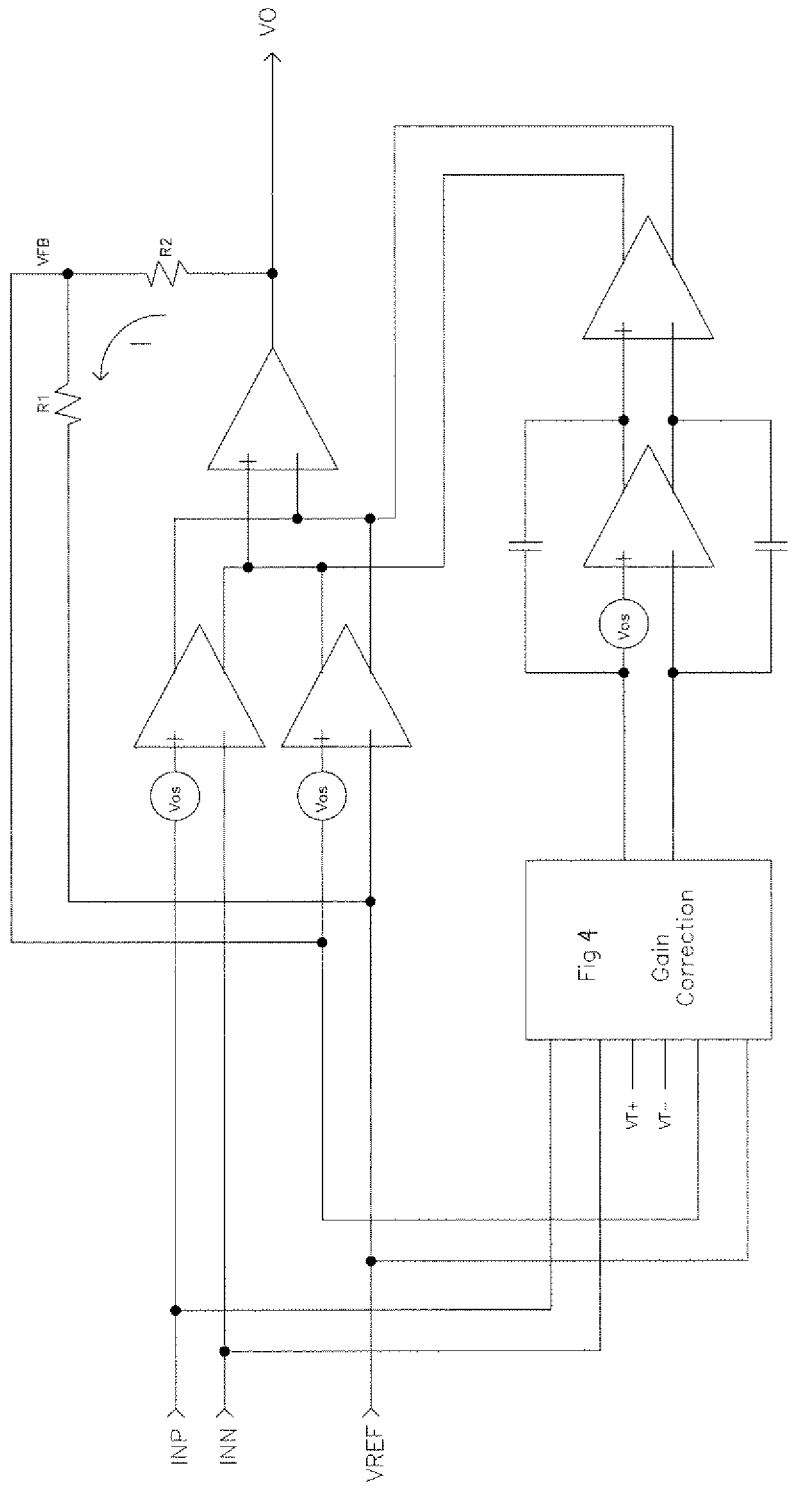
FIG. 6a is a diagram illustrating a gain-corrected feedforward instrumentation amplifier system using the gain correction circuit of FIG. 4.
Figure 6B:
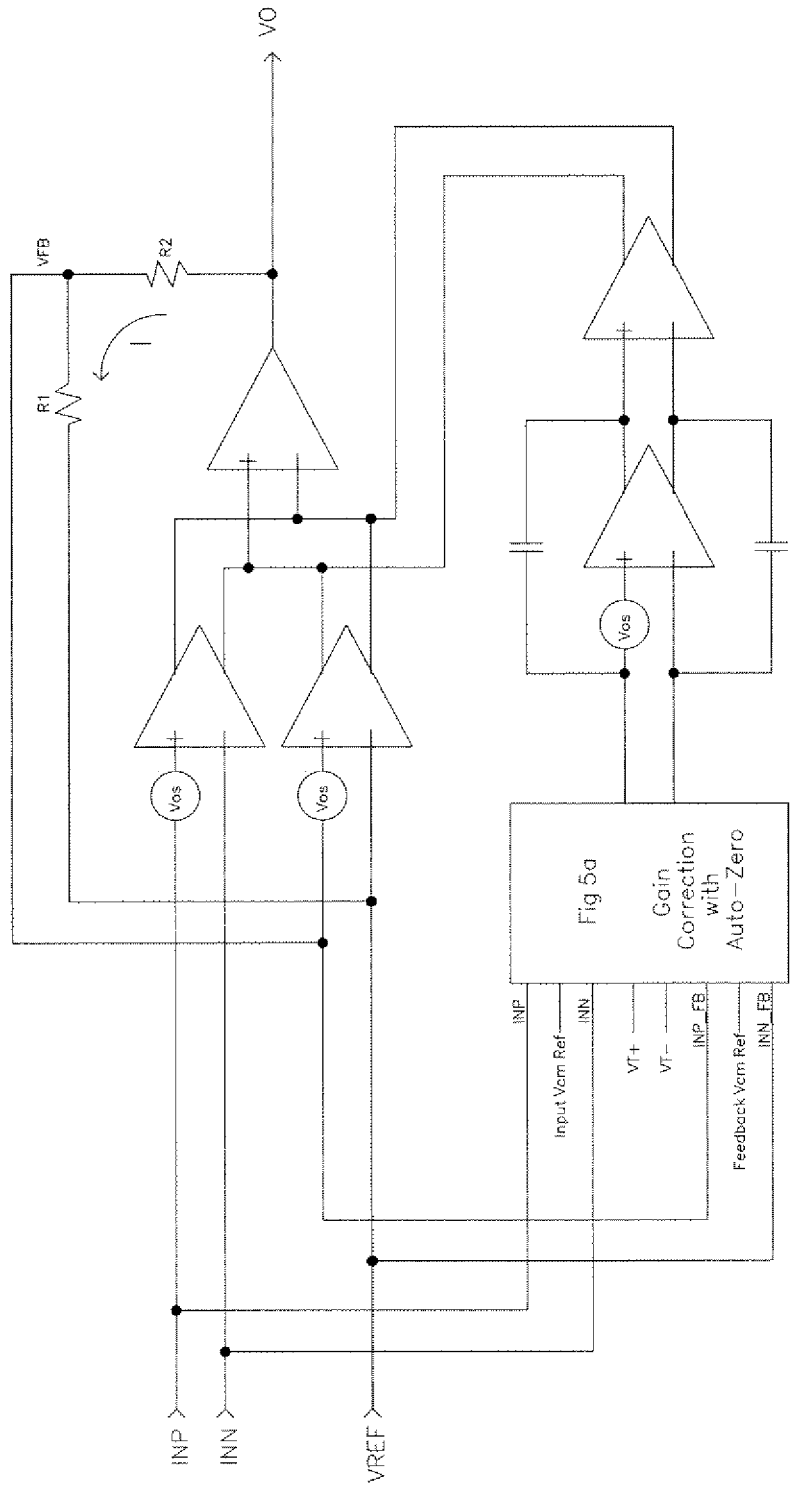
Figure 7A:
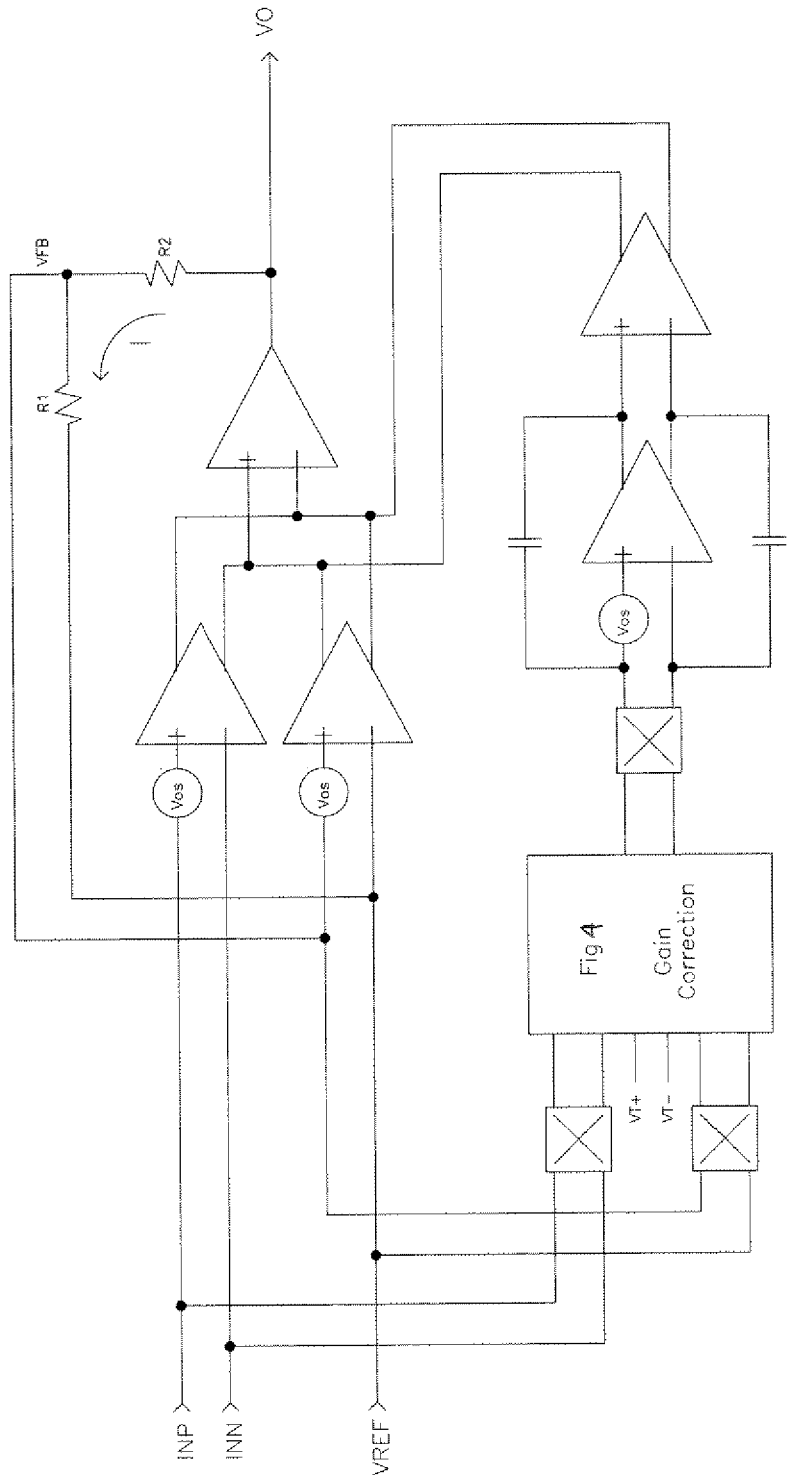
FIG. 7a is a diagram illustrating a gain-corrected chopper-stabilized feedforward instrumentation amplifier system using the gain correction circuit of FIG. 4.
Figure 7B:
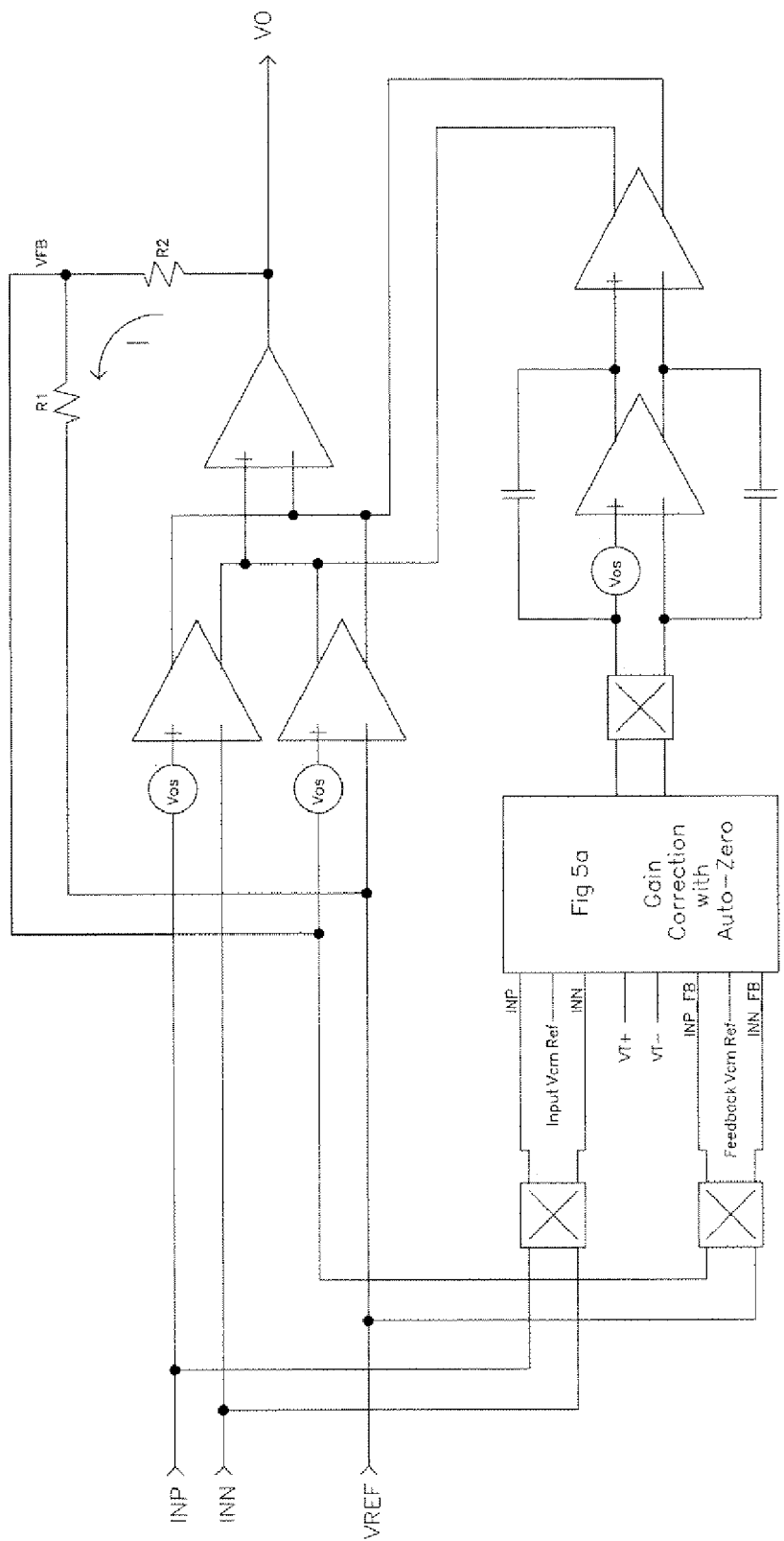
Figure 8A:
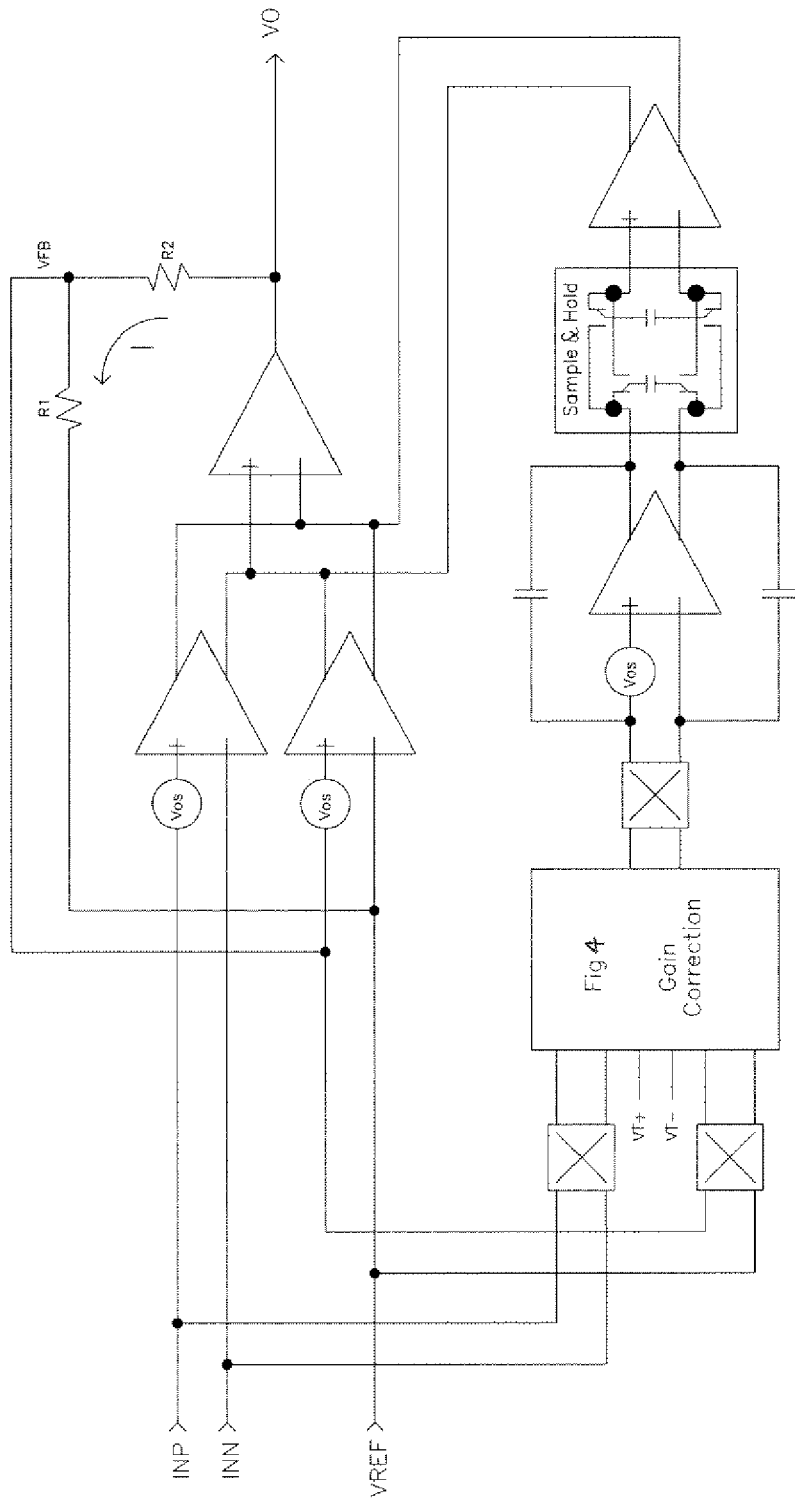
FIG. 8a is a diagram illustrating a gain-corrected, chopper-stabilized feedforward instrumentation amplifier system with sample-and-hold using the gain correction of FIG. 4.
Figure 8B:
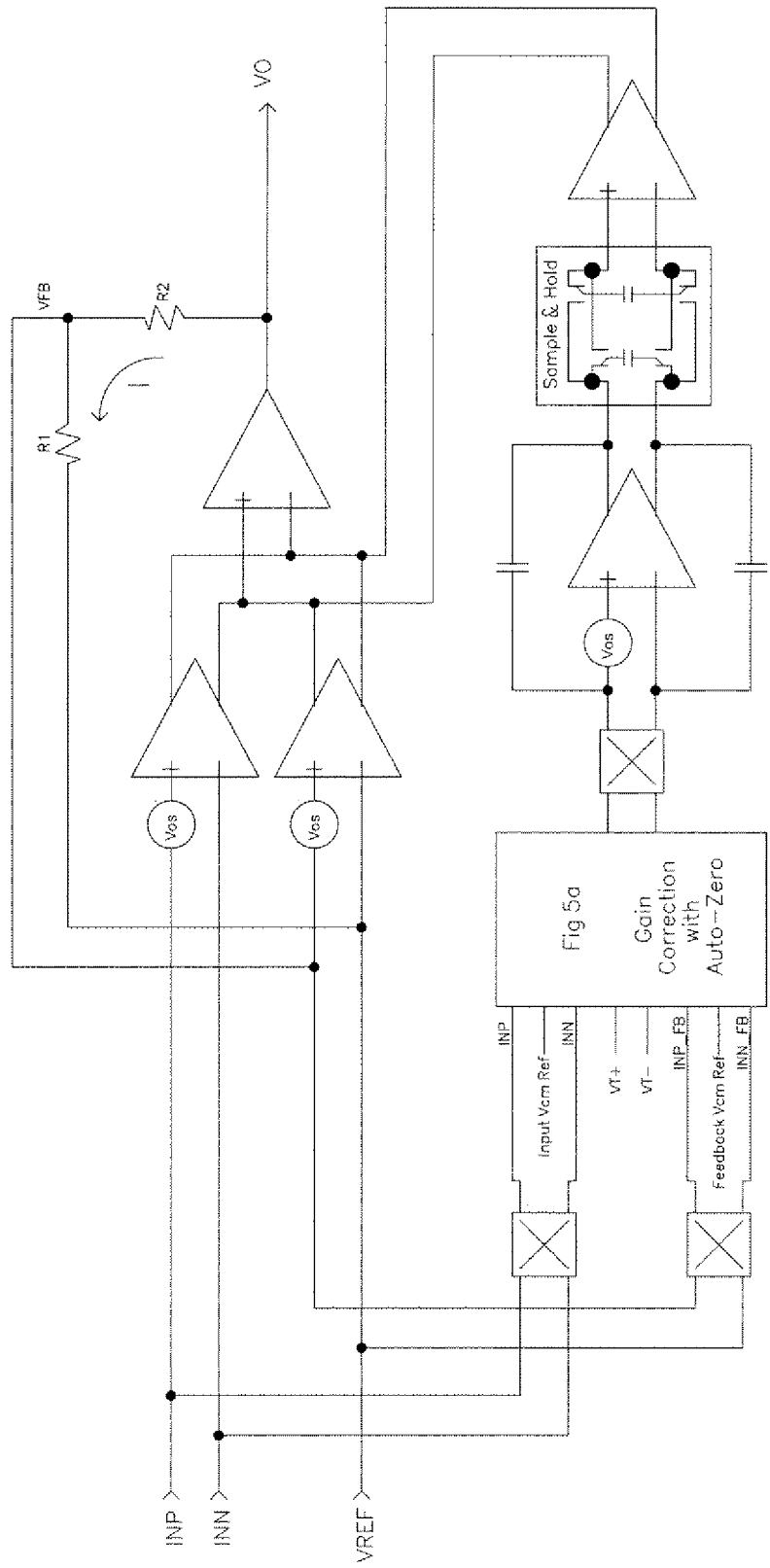

Aspects of the present invention may be practiced various ways. By way of example, FIG. 5a is a Figure incorporating the features of both FIG. 3 and FIG. 4 in a single FIGURE. FIG. 5b is a Figure incorporating the features of both FIG. 3 and FIG. 4 in an instrumentation amplifier with choppers. FIG. 6a is a diagram illustrating a feedforward gain-corrected instrumentation amplifier system using the gain correction circuit of FIG. 4. FIG. 6b is a diagram illustrating a gain-corrected, auto-zeroed feedforward instrumentation amplifier system using the combined auto correction and gain correction configuration of instrumentation amplifier of FIG. 5a. FIG. 7a is a diagram illustrating a gain-corrected, chopper-stabilized feedforward instrumentation amplifier system using the gain correction circuit of FIG. 4. FIG. 7b is a diagram illustrating a gain-corrected, auto-zeroed chopper-stabilized feedforward instrumentation amplifier system using the combined auto correction and gain correction configuration of instrumentation amplifier of FIG. 5a. FIG. 8a is a diagram illustrating a gain-corrected, chopper-stabilized feedforward instrumentation amplifier system with sample-and-hold using the gain correction circuit of FIG. 4, and FIG. 8b is a diagram illustrating a gain-corrected, auto-zeroed chopper-stabilized feedforward instrumentation amplifier system with sample-and-hold using the combined auto correction and gain correction configuration of instrumentation amplifier of FIG. 5a. The outputs of the choppers coupled to the output of FIGS. 4 (FIG. 8a) and 5a (FIG. 8b) is a square wave of current, which when integrated by the following integrator, provides a triangular waveform. The sample-and-hold circuit repetitively samples the triangular waveform at the same place on the waveform (preferably at the center). This eliminates the output ripple in VO that may be caused by the integrator output.

In the foregoing description, the invention has been described with respect to the use of transconductance amplifiers and the use of MOS devices. A transconductance amplifier may be referred to as a GM stage or differential amplifier and is considered to be balanced and symmetrical. The depiction of an inverting or non-inverting output terminal of a transconductance amplifier is relative to the depiction of the inputs of that amplifier. Any systematic depiction of input and output polarities and the resulting connections which meet the requirements of negative feedback to achieve stability are also included in this disclosure. Such a construction of the present invention is preferred, but is not a limitation of the invention. Other devices, such as junction transistors, may also be used if desired. Also, references herein and in the following claims to an amplifier or a transconductance amplifier do not suggest only single stage amplifiers, but may also include cascaded amplifier stages. Assuming multiple stages in the upper signal flow path of FIGS. 6a through 8b, the offset correction from the integrator may be applied to any of the multiple stages. Similarly a reference to an amplifier or transconductance amplifier having two differential inputs generally includes amplifiers and transconductance amplifiers having parallel differential input stages in which the outputs of the input stages are combined to provide a single parallel output as the amplifier output or for coupling to a subsequent differential stage of the amplifier. Generally, the output of a differential amplifier requires additional circuitry to regulate the common mode voltage of the differential outputs relative to a fixed potential within the circuit, as is well known in the art. This requirement applies as appropriate to the differential amplifiers incorporated in the preferred embodiments of the present invention. The addition or removal of series and redundant switches is covered by the claims of this invention. Finally, the invention may be used alone, in sub-combinations or with other instrumentation amplifier performance enhancing embellishments, as desired.

Thus while certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. An instrumentation amplifier having first and second differential instrumentation amplifier inputs and a differential instrumentation amplifier output comprising:
    first and second variable gain differential input amplifiers, each having a differential input, and having their differential outputs coupled to provide a common differential output;
    a third differential amplifier having a first capacitor coupled across its differential input, and having each of its differential outputs coupled to control the gain of a respective one of the first and second variable gain differential input amplifiers;
    first switches coupled to the common differential output to disconnect the common differential output of the first and second variable gain differential input amplifiers from the differential instrumentation amplifier output and couple the output of the first and second variable gain differential input amplifiers to the differential input of the third differential amplifier;
    second switches operative with the first switches to disconnect the first and second differential instrumentation amplifier inputs from the first and second variable gain differential input amplifier differential inputs, and to couple the differential inputs of the first and second variable gain differential input amplifiers to a single differential voltage with a polarity whereby the combined output is the difference in differential output of the first and second variable gain differential input amplifiers;
    whereby on momentarily operating the first and second switches, a voltage is stored on the first capacitor providing a differential output of the third differential amplifier correcting the differences in gain in the first and second variable gain differential input amplifiers.

2. The instrumentation amplifier of claim 1 further comprising a first chopper coupled to the first differential instrumentation amplifier input, a second chopper coupled to the second differential instrumentation amplifier input and a third chopper coupled to the differential instrumentation amplifier output.

3. The instrumentation amplifier of claim 1 wherein the second switches are coupled by second capacitors to the differential inputs of the first and second variable gain differential input amplifiers, and further comprising third switches for disconnecting the first and second differential instrumentation amplifier inputs and coupling the common differential output to the differential inputs of the first and second variable gain differential input amplifiers, and for coupling the inputs to the capacitors coupled to the differential input of the first variable gain differential input amplifier together and for coupling the inputs to the capacitors coupled to the differential input of the second variable gain differential input amplifier together;
    whereby on momentarily closing the third switches, a voltage is stored on the second capacitors, zeroing the first and second variable gain differential input amplifiers.

4. The instrumentation amplifier of claim 3 further comprising a first chopper coupled to the first differential instrumentation amplifier input, a second chopper coupled to the second differential instrumentation amplifier input and a third chopper coupled to the differential instrumentation amplifier output.

5. The instrumentation amplifier of claim 4 wherein the third switches also couple the inputs to the capacitors coupled to the differential input of the first variable gain differential input amplifier to a common mode reference, and couple the inputs to the capacitors coupled to the differential input of the second variable gain differential input amplifier to another common mode reference.

6. The instrumentation amplifier of claim 5 further comprising a first chopper coupled to the first differential instrumentation amplifier input, a second chopper coupled to the second differential instrumentation amplifier input and a third chopper coupled to the differential instrumentation amplifier output.

7. A feedforward instrumentation amplifier system having a differential instrumentation amplifier system input and an instrumentation amplifier system output comprising:
an instrumentation amplifier having a first and second differential instrumentation amplifier inputs and a differential instrumentation amplifier output, and having:
first and second variable gain differential input amplifiers, each having a differential input, and having their differential outputs coupled to provide a common differential output;
a third differential amplifier having a first capacitor coupled across its differential input, and having each of its differential outputs coupled to control the gain of a respective one of the first and second variable gain differential input amplifiers;
first switches coupled to the common differential output to disconnect the common differential output of the first and second variable gain differential input amplifiers from the differential instrumentation amplifier output and couple the output of the first and second variable gain differential input amplifiers to the differential input of the third differential amplifier;
second switches operative with the first switches to disconnect the first and second differential instrumentation amplifier inputs from the first and second variable gain differential input amplifier differential inputs, and to couple the differential inputs of the first and second variable gain differential input amplifiers to a single differential voltage with a polarity whereby the combined output is the difference in differential output of the first and second variable gain differential input amplifiers;
whereby on momentarily operating the first and second switches, a voltage is stored on the first capacitor providing a differential output of the third differential amplifier correcting the differences in gain in the first and second variable gain differential input amplifiers;
fourth, fifth and sixth differential input amplifiers, the fourth and fifth amplifiers each having a differential output;
the differential outputs of the fourth and fifth differential input amplifiers being coupled together and to the differential input of the sixth differential input amplifier, the output of the sixth differential input amplifier being coupled to the instrumentation amplifier system output;
the differential instrumentation amplifier system input being coupled to the differential input of the fourth differential input amplifier and to the differential input of the first variable gain differential input amplifier;
the differential input of the fifth differential input amplifier and the differential input of the second variable gain differential input amplifier being coupled together for coupling to a differential feedback signal from the instrumentation amplifier system output;
the common differential output of the first and second variable gain differential input amplifiers being coupled to an integrator, an output of the integrator being coupled to the differential input of the sixth differential input amplifier.

8. The feedforward instrumentation amplifier system of claim 7 wherein one of the differential feedback signals is coupled to a reference voltage.

9. The feedforward instrumentation amplifier system of claim 7 wherein the instrumentation amplifier further comprises a first chopper coupled to the first differential instrumentation amplifier input, a second chopper coupled to the second differential instrumentation amplifier input and a third chopper coupled between the differential instrumentation amplifier output and the integrator.

10. The feedforward instrumentation amplifier system of claim 9 further comprised of a sample and hold circuit between the output of the integrator and the differential input of the sixth differential input amplifier.

11. The feedforward instrumentation amplifier system of claim 7 wherein in the instrumentation amplifier, the second switches are coupled by second capacitors to the differential inputs of the first and second variable gain differential input amplifiers, and further comprising third switches for disconnecting the first and second differential instrumentation amplifier inputs and coupling the common differential output to the differential inputs of the first and second variable gain differential input amplifiers, and for coupling the inputs to the capacitors coupled to the differential input of the first variable gain differential input amplifier together and for coupling the inputs to the capacitors coupled to the differential input of the second variable gain differential input amplifier together;
whereby on momentarily closing the third switches, a voltage is stored on the second capacitors, zeroing the first and second variable gain differential input amplifiers.

12. The feedforward instrumentation amplifier system of claim 11 wherein the instrumentation amplifier further comprises a first chopper coupled to the first differential instrumentation amplifier input, a second chopper coupled to the second differential instrumentation amplifier input and a third chopper coupled to the differential instrumentation amplifier output.

13. The feedforward instrumentation amplifier system of claim 11 wherein in the instrumentation amplifier, the third switches also couple the inputs to the capacitors coupled to the differential input of the first variable gain differential input amplifier to common mode reference, and couple the inputs to the capacitors coupled to the differential input of the second variable gain differential input amplifier to another common mode reference.

14. The feedforward instrumentation amplifier system of claim 13 wherein in the instrumentation amplifier further comprises a first chopper coupled to the first differential instrumentation amplifier input, a second chopper coupled to the second differential instrumentation amplifier input and a third chopper coupled to the differential instrumentation amplifier output.

15. The feedforward instrumentation amplifier system of claim 14 further comprised of a sample and hold circuit between the output of the integrator and the differential input of the sixth differential input amplifier.

16. In an amplifier unit having first and second variable gain differential input amplifiers, and having first and second amplifier unit differential inputs and an amplifier unit differential output, a method of gain correction to match the gains of the first and second differential input amplifiers comprising:
coupling differential outputs of the first and second variable gain differential input amplifiers in common;
coupling the first and second amplifier unit differential inputs to the differential inputs of the first and second variable gain differential input amplifiers, respectively;
coupling the common coupling of the differential outputs of the first and second variable gain differential input amplifiers to the amplifier unit differential output;
providing a third differential input amplifier having a respective one of its differential output to control the gain of a respective one of the first and second variable gain differential input amplifiers; and, repetitively;

momentarily decoupling the first and second amplifier unit differential inputs from the differential inputs of the first and second variable gain differential input amplifiers, respectively, and momentarily de-coupling the common coupling of the differential outputs of the first and second variable gain differential input amplifiers from the amplifier unit differential output, and momentarily coupling each of the common connections of the first and second variable gain differential input amplifiers to a respective one of the differential inputs of the third differential input amplifier, and momentarily applying a differential input to the first and second variable gain differential input amplifiers, and capacitively storing a differential voltage on the differential input of the third differential input amplifier.

17. The method of claim 16 wherein the differential voltage on the differential input of the third differential input amplifier is stored on a capacitor coupled across the differential input of the third differential input amplifier.

18. The method of claim 16 wherein the amplifier unit is in a feedforward signal path of a feedforward gain-corrected instrumentation amplifier system.

19. The method of claim 18 further comprising:

chopping the first and second amplifier unit differential inputs and the amplifier unit differential output.

20. The method of claim 19 further comprising:

integrating the chopped amplifier unit differential output;

sampling the integrated chopped amplifier unit differential output by a sample and hold circuit; and coupling an output of the sample and hold circuit to an output of the feedforward gain-corrected instrumentation amplifier system.

21. The method of claim 16 wherein the first and second variable gain differential input amplifiers have capacitively coupled differential inputs, and further comprising:

auto-zeroing the first and second variable gain differential input amplifiers by:

momentarily de-coupling the first and second amplifier unit differential inputs from the capacitively coupled differential inputs of the first and second variable gain differential input amplifiers, respectively, and momentarily de-coupling the common coupling of the differential outputs of the first and second variable gain differential input amplifiers from the amplifier unit differential output; and momentarily shorting the capacitive coupled differential inputs of each of the first and second capacitively coupled differential input amplifiers;

thereby canceling input offsets by voltages stored on the capacitive coupling on the differential inputs of the first and second differential input amplifiers.

22. The method of claim 21 further comprising:

when momentarily shorting the capacitive coupled differential inputs of each of the first and second capacitively coupled differential input amplifiers, coupling the shorted differential input to the first differential input amplifier to a voltage approximating a common mode voltage of the first amplifier unit differential input, and coupling the shorted differential input to the second differential input amplifier to a voltage approximating a common mode voltage of the second amplifier unit differential input.

23. The method of claim 21 further comprising:

alternately correcting the gain of the first and second differential input amplifiers and auto-zeroing the first and second variable gain differential input amplifiers.

24. The method of claim 21 further comprising:

chopping the first and second amplifier unit differential inputs and the amplifier unit differential output.

25. The method of claim 21 wherein the amplifier unit is in a feedforward signal path of a feedforward gain-corrected instrumentation amplifier system.

26. The method of claim 25 further comprising:

chopping the first and second amplifier unit differential inputs and the amplifier unit differential output.

27. The method of claim 26 further comprising:

integrating the chopped amplifier unit output;

sampling the integrated chopped amplifier unit differential output by a sample and hold circuit; and coupling an output of the sample and hold circuit to an output of the feedforward gain-corrected instrumentation amplifier system.

* * * * *